United States Patent [19]

Wright et al.

[11] Patent Number: 4,687,725
[45] Date of Patent: Aug. 18, 1987

[54] METHOD FOR FORMING RELIEF IMAGES AND PHOTOSENSITIVE MATERIAL USEFUL THEREIN

[75] Inventors: Richard F. Wright, Dayton; Paul C. Adair, Springboro; Frederick W. Sanders, Chillicothe, all of Ohio

[73] Assignee: The Mead Corporation, Dayton, Ohio

[21] Appl. No.: 791,801

[22] Filed: Oct. 25, 1985

[51] Int. Cl.⁴ .............. G03C 1/495; G03C 1/68; G03F 7/26
[52] U.S. Cl. ................... 430/138; 430/202; 430/253
[58] Field of Search ............ 430/138, 202, 253

[56] References Cited

U.S. PATENT DOCUMENTS

| | | | |
|---|---|---|---|
| 3,867,150 | 2/1975 | Ketley | 96/36.3 |
| 4,399,209 | 8/1983 | Sanders et al. | 430/138 |
| 4,440,846 | 4/1984 | Sanders et al. | 430/138 |
| 4,501,809 | 2/1985 | Hiraishi et al. | 430/138 |

Primary Examiner—Richard L. Schilling
Attorney, Agent, or Firm—Biebel, French & Nauman

[57] ABSTRACT

Methods for forming relief images are disclosed employing photosensitive microcapsules; typically, the internal phase of the microcapsules includes a photohardenable composition such as an ethylenically unsaturated compound and a photoinitiator; release of the composition is controlled by exposure and the application of a uniform rupturing force such as pressure; in one embodiment, the released composition functions as a resist image for subsequent processing with an etching agent such as an acid.

26 Claims, 3 Drawing Figures

METHOD FOR FORMING RELIEF IMAGES AND PHOTOSENSITIVE MATERIAL USEFUL THEREIN

BACKGROUND

The present invention relates to a method for forming relief images such as letter press and, more particularly, intaglio printing plates.

Processes for forming relief images are well known in the art. A wide variety of materials and methods are available. Typically a plate bearing a film of a photopolymerizable composition is image-wise exposed to actinic radiation. Exposure renders the film less soluble in a developing liquid (typically a solvent for the unpolymerized composition) with which the plate is washed to selectively remove the polymer film and yield polymeric resist images. Depending on the materials used, this product may represent a finished printing plate which is essentially ready for inking. Otherwise, the plate may be etched to carry the image into the surface of the plate as in the case of gravure printing.

While numerous methods for forming relief images are known in the art, there is a need for alternative, efficient, and more simplified methods.

SUMMARY OF THE INVENTION

A principal object of the present invention is to provide a simplified method for the preparation of relief images.

A related object of the present invention is to provide a method for forming relief images through the use of photosensitive microcapsules which have a discrete capsule wall and contain a photosensitive composition in the internal phase.

Another object of the present invention is to provide a photosensitive material useful in forming relief images.

Commonly assigned U.S. Pat. Nos. 4,399,209 and 4,440,846 to Sanders et al. disclose an imaging system which employs a microcapsule containing a photosensitive composition. The composition is one which changes in viscosity in response to actinic radiation. In the imaging system described in the patents, the microcapsules contain a color former, a substantially colorless compound which reacts with a developer compound to form a visible image. Typically, the color former is an electron donor and the developer is an electron acceptor. In contact with the developer, the color former transfers its electron and becomes visibly colored. An imaging sheet, which carries a layer of the microcapsules on its surface, is image-wise exposed to actinic radiation and subjected to a uniform rupturing force. This causes the microcapsules to rupture. As a result of differential hardening of the microcapsules achieved through exposure, the microcapsules image-wise release their contents for reaction with the developer. In the case of U.S. Pat. No. 4,399,209, the developer is on a separate sheet, and in the case of U.S. Pat. No. 4,440,846, the developer is on the same sheet as the microcapsules. A visible image is thereby formed.

In accordance with the present invention, microcapsules containing photosensitive compositions which exhibit a change in viscosity, directly or indirectly, as a result of their exposure to actinic radiation are used in forming relief images.

In accordance with one embodiment of the invention, a layer of microcapsules containing a photosensitive composition, as described above, is provided on an etchable support, such as a support useful in preparing a printing plate, a printed circuit, or the like. The layer of microcapsules is image-wise exposed to actinic radiation and subjected to a uniform rupturing force. This causes the microcapsules to rupture and image-wise release their contents as in the Sanders patents. When the photosensitive composition is a photohardenable composition, unhardened composition is released from the microcapsules in the unexposed areas whereas, in the exposed areas, the composition is hardened and is retained in the microcapsules. Where the microcapsules contain a photosoftenable composition, the opposite result is achieved.

The released photosensitive composition is caused to migrate to a support where it can function as a resist image. This support can be the same support upon which the microcapsules are carried or it can be a separate support to which the photosensitive composition is transferred as by passing the support carrying the microcapsules and the support receiving the photosensitive composition between a pair of pressure rollers. An etching agent can be applied to the support which image-wise etches its surface. In the areas in which the photosensitive composition is released from the microcapsules, the composition protects the underlying surface and prevents it from being etched. Where the composition is not released, the etchant penetrates the microcapsule layer and etches the underlying surface. Subsequently, by washing the support to remove the etchant and the layer of microcapsules and/or the photosensitive composition, relief images in the form of the etched surface are obtained.

In accordance with another embodiment of the invention, the microcapsules may include a photosensitive composition and an etchant for the support. In this case, upon exposing and subjecting the layer of microcapsules to a uniform rupturing force, the etchant is image-wise, selectively released from the capsules. In the areas in which it is released, it etches the underlying substrate. A relief image in the form of the differentially etched surface is again obtained.

In another embodiment of the invention, the photosensitive material includes a support, a layer of a hardenable composition or resin such as gelatin, a polymer, or a prepolymer, and a layer of microcapsules containing a photosensitive composition and a hardening agent for the hardenable composition or resin. Exposure of the microcapsules and subjecting the microcapsules to a uniform rupturing force results in the hardening agent being image-wise released form the microcapsules. The hardening agent migrates to the underlying layer and hardens it through crosslinking, or further polymerization or the like. Subsequently, application of a solvent for the unhardened composition washes it away and leaves a resistant image. This image can be used for planographic printing, or, depending on the nature of the support, the support can be etched to provide an intaglio plate.

In another embodiment of the invention, which is a variation of the foregoing embodiment, a layer of a composition is carried on the support which is softened by the agent released from the microcapsules.

BRIEF DESCRIPTION OF THE DRAWINGS

FIG. 1 is a schematic illustration of one process in accordance with the present invention.

FIG. 2 is a schematic illustration of another process in accordance with the present invention wherein the microcapsules contain an etchant.

FIG. 3 is a schematic illustration of a third process in accordance with the present invention wherein the photosensitive material additionally includes a chemically hardenable layer and the microcapsules contain a hardening agent.

DETAILED DESCRIPTION OF THE INVENTION

The disclosures in commonly assigned U.S. Pat. Nos. 4,399,209 and 4,440,846 relating to the preparation of microcapsules containing photosensitive compositions and the mechanisms by which they rupture, release their contents and yield images are incorporated herein by reference.

FIG. 1 illustrates an embodiment of the invention wherein the internal phase of the microcapsules consists essentially of a photohardenable composition. There photosensitive material 100 includes a support 110 having an etchable layer 112 on the surface thereof. The etchable layer 112 may be provided as a separate layer or may simply be the surface of the support 110. In accordance with this embodiment of the invention, the etchable layer 112 is overcoated with a layer 114 of microcapsules 120 having liquid internal phase 118. As mentioned earlier, a transfer technique analogous to that described in U.S. Pat. No. 4,399,209 could also be used, in which case the microcapsules would be carried on a separate support which is assembled with the support upon which the polymer image is to be formed after exposure, and the two are passed through the nip between a pair of pressure rollers.

Figure 1A:
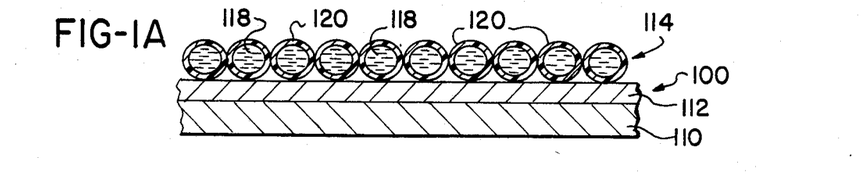
Figure 1B:
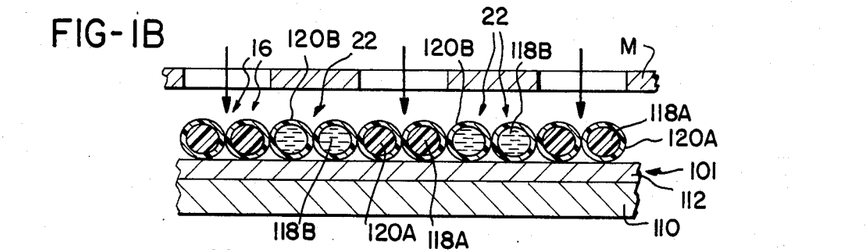

In FIG. 1B, the photosensitive material is shown being exposed through photomask or stencil M. In the exposed areas 16, the internal phase 118A of the microcapsules 120A is polymerized or crosslinked by the actinic radiation. The internal phase is shown as being solid. In fact, the internal phase 118A in the exposed areas 16 may actually be converted from a liquid to a less liquid form or from a semi-solid to more solid form. This is explained in more detail in U.S. Pat. No 4,399,209. In the unexposed areas 22, the internal phase 118B of the microcapsules 120B remains liquid. What is critical to the formation of the relief image is that upon subjecting the layer of microcapsules to the uniform rupturing force, the internal phase is released from the capsules in the unexposed or underexposed areas, whereas it is not released in the fully exposed areas.

Figure 1C:
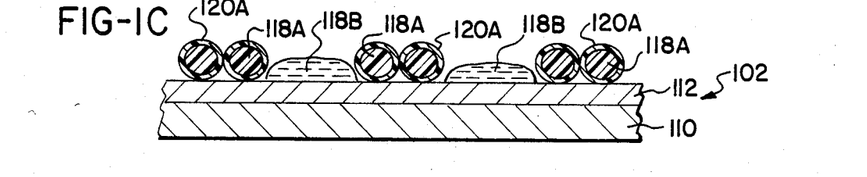

FIG. 1C is a schematic illustration of the product which results after subjecting the layer 114 of microcapsules 120A and 120B to a uniform rupturing force. This uniform rupturing force is most typically pressure which is applied to the layer of microcapsules by passing the photosensitive material through the nip between a pair of pressure rollers, however, forces other than pressure can be used. U.S. Pat. No. 4,448,516, which is incorporated herein by reference, discloses the use of a fibrous developer roll to rupture the microcapsules. The use of a fibrous developer roll is advantageous because high line pressures are not required to obtain uniform development. In addition, microcapsules can be designed which are rupturable by forces such as ultrasonic energy and heating.

Upon subjecting the microcapsules to a uniform rupturing force, the microcapsules 120A in the fully exposed areas do not release their contents 118A, whereas the microcapsules 120B in the unexposed or underexposed areas release the internal phase 118B, as schematically shown. While the microcapsules 120A in the exposed areas are shown in FIG. 1C as unruptured, as explained in more detail in U.S. Pat. No. 4,399,209, these capsules may actually be ruptured, but due to the polymerization of the internal phase 118A, the internal phase is not released from the capsules upon subjecting the microcapsules to the uniform rupturing force. Those skilled in the art will understand that two events are necessary to form the relief image. The microcapsules must rupture and the microcapsule must exude the internal phase. If either event is prevented through exposure, no image is formed.

The intermediate shown in FIG. 1C can be processed by either of two routes depending upon the nature of the internal phase of the microcapsules. If the internal phase 118B released from the microcapsules is the type that is resistant to the etching agent that is used to develop the relief image, the etching agent can be applied directly to the intermediate 102 shown in FIG. 1C. On the other hand, if the composition released from the microcapsules is the type which must be hardened, then it is necessary to harden the released composition. Since the composition released from the microcapsules is a photosensitive composition, one method for hardening the released composition 118B is to uniformly expose the photosensitive material to actinic radiation of the same type used to image-wise expose the microcapsules. Alternatively, the photosensitive material might be heated to harden the released photosensitive composition. The released composition could also be hardened chemically although this would be substantially less convenient.

Figure 1D:
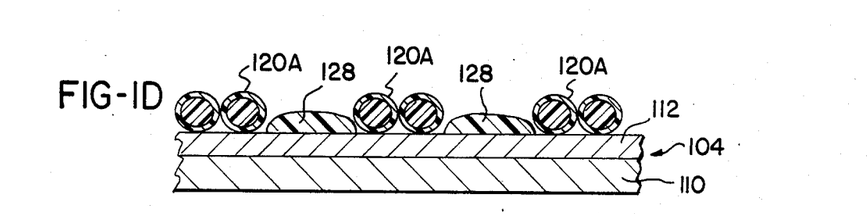

In FIG. 1D, the photosensitive material is shown after being uniformly exposed to actinic radiation. Exposure has the effect of cross-linking the released photosensitive composition and yielding a hardened polymer image 128.

Figure 1E:
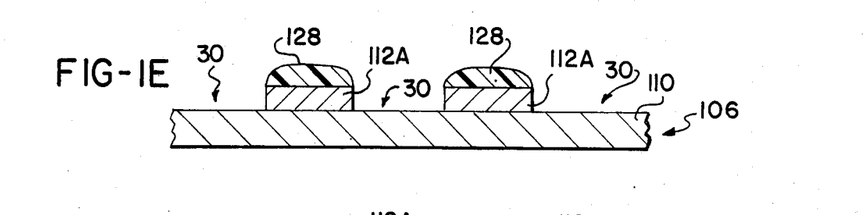

Upon applying the etching agent to the surface of the intermediate 102 shown in FIG. 1C or 104 shown in FIG. 1D, the etching agent readily penetrates the unruptured microcapsules 120A and removes the underlying etchable layer 112 in the areas 30 as shown in FIG. 1E to yield the intermediate 106. On the other hand, the polymeric image 128 is resistant to the etching agent and, as such, the etchable layer 112A is not removed in areas 32 which are protected by the image 128.

Figure 1F:
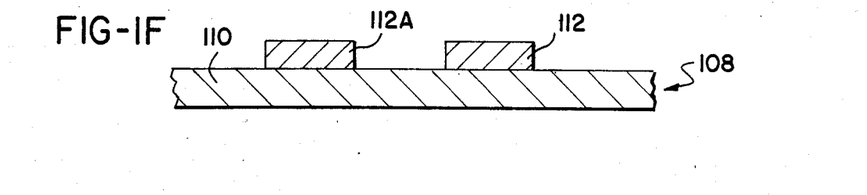

Upon subsequent washing to remove the polymer image, a relief image 112A such as an intaglio plate 108 is formed as shown in FIG. 1F.

FIG. 2 illustrates the embodiment of the invention wherein the microcapsules include both a photosensitive composition and an etching agent. In FIG. 2, a photosensitive material 200 includes a support 210, an etchable layer 212 and a layer 214 of microcapsules 220 containing a photosensitive composition and an etchant in the internal phase 218.

Figure 2A:
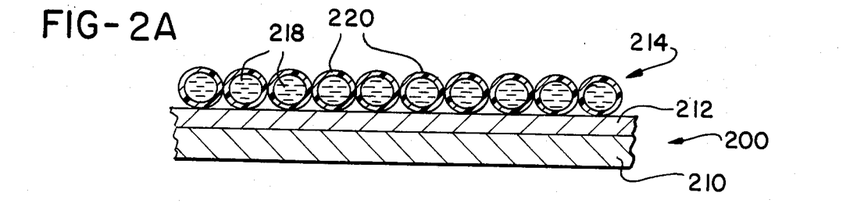
Figure 2B:
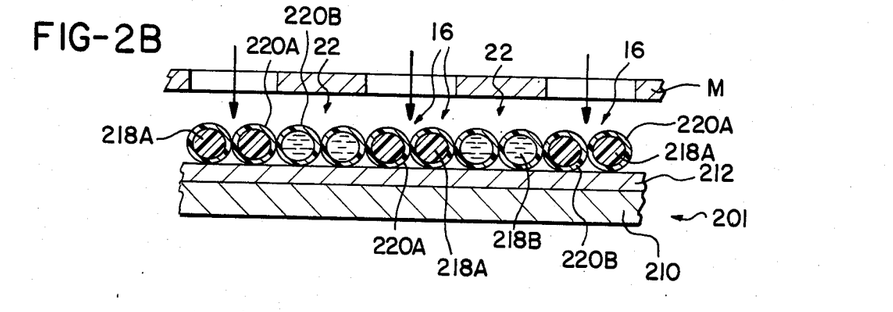

The photosensitive material 201 is shown in FIG. 2B being exposed image-wise to actinic radiation through a photomask M. In the exposed areas 16, the internal phase 218A of the microcapsules 220A is shown as being hardened by the actinic radiation whereas in the unexposed areas 22, the internal phase 218B of the microcapsules 220B remains liquid.

Figure 2C:
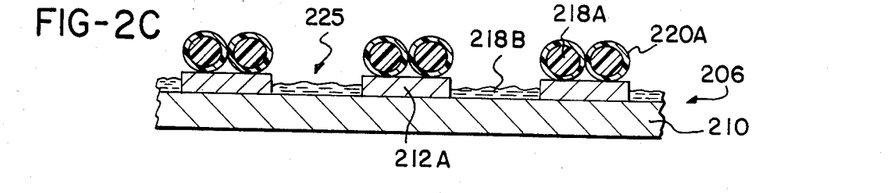
Figure 2D:
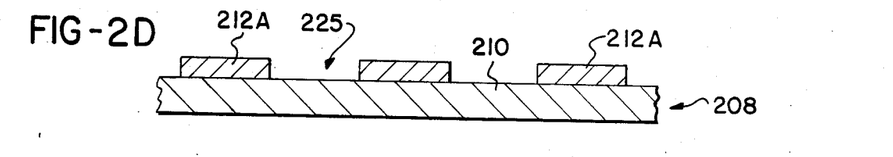

In accordance with this embodiment of the invention, upon subjecting the layer 214 of microcapsules 220A and 220 B to a uniform rupturing force, the microcapsules 220B in the unexposed areas rupture and release the etchant whereas the microcapsules 220A in the exposed areas do not. Thus, as shown in FIG. 2C, in the areas 22 in which the photosensitive material is not exposed, the etchant in the released phase 218B attacks the etchable layer 212 and removes it as shown at 225. On the other hand, in areas 16 in which the microcapsules 220A are exposed, the etchant is not released and the etchable layer 212A remains intact. Upon subsequently washing the photosensitive material 206 as shown in FIG. 1D, the product 208 is obtained.

In FIG. 3, the photosensitive material 300 comprises a support 310, an etchable layer 312 a layer of a chemically hardenable composition such as a hardenable polymer or prepolymer 340, and a layer 314 of photosensitive microcapsules 320 containing, as the internal phase 318, a photosensitive composition and an agent which is capable of reacting with the polymer or prepolymer in layer 340 and hardening it. The term "chemically hardenable," as used herein, is used in contrast to a photohardenable composition which is hardened via exposure to actinic radiation and refers to compositions which are hardened through the application of a chemical agent. Typically, these compositions are hardened through polymerization or crosslinking.

Figure 3A:
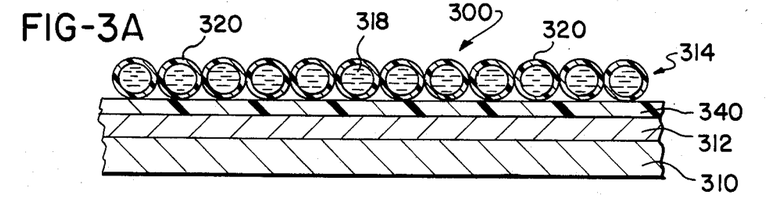
Figure 3B:
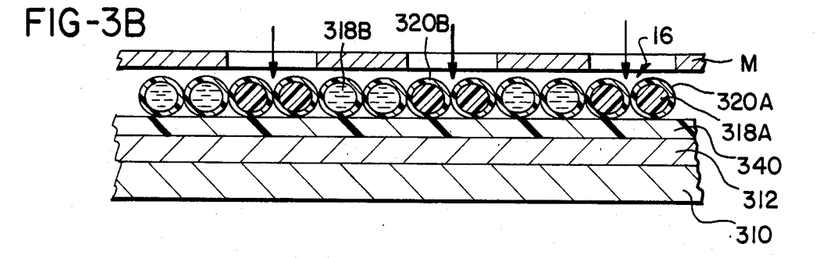

In FIG. 3B, the photosensitive material 302 is shown after exposure to actinic radiation through a photomask M. As in FIG. 1 and FIG. 2, the microcapsules 320A are shown as having a solid internal phase 318A in the exposed areas 16 and the microcapsules 320B are shown as having a liquid internal phase 318B in the unexposed areas 22.

Figure 3C:
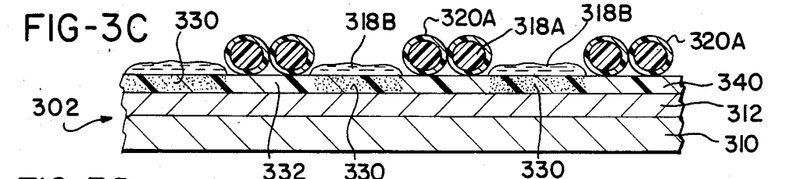

Upon subjecting the microcapsules 320A and 320B to a uniform rupturing force, as shown in FIG. 3C, the microcapsules 320B rupture and release the composition 318B containing the hardening agent to the underlying layer of polymer or prepolymer 340. This hardens the layer 340 in the areas 330. The microcapsules 320A in the exposed areas do not release the hardening agent and, as such, the layer 340 remains unhardened in the areas 332. Upon washing the intermediate 302 shown in FIG. 3C in a solvent for the polymer or prepolymer in layer 340, the polymer is removed from the areas 332, but a hardened polymeric image 334 remains in the areas 330 as shown in FIG. 3D.

Figure 3D:
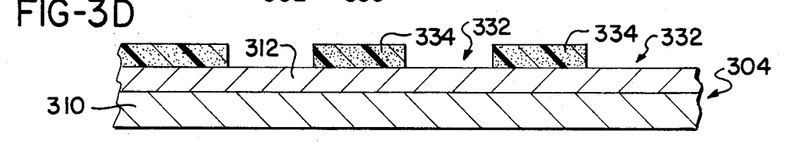
Figure 3E:
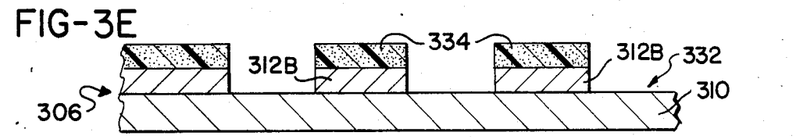
Figure 3F:
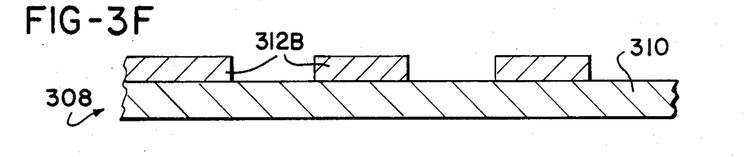

The intermediate 304 shown in FIG. 3D will be useful in certain applications, depending upon the materials which are selected for the support 310 and the polymer or prepolymer layer 340. For example, the intermediate shown in FIG. 3D may be useful as a planographic printing plate. In accordance with other embodiments of the invention, however, the intermediate shown in FIG. 3D may be further processed using an etching agent. In accordance with these embodiments, an etching agent is applied to remove the etchable layer in the areas 332 which are not protected by the polymeric image 334 as shown in FIG. 3E. The layer 312 remains intact in the areas 312B which are protected. Upon washing the intermediate 306 to remove the etchant and the polymeric image, a relief 308 as shown in FIG. 3F is obtained. It will be appreciated that this method is positive-working.

In a further embodiment of the present invention, the hardenable composition layer 340 is replaced by a layer of a chemically softenable composition such as a novolak resin. In this embodiment, a softening agent for th layer 340 is released from the microcapsules. Whereas the photoimaging material illustrated in FIG. 3 is positive working, the analogous material employing a chemically softenable composition is negative working.

In FIGS. 1-3 the invention has been illustrated for embodiments in which the microcapsule layer is formed directly on the support on which the relief image is desired. Those skilled in the art will appreciate that the microcapsule layer can be carried on a separate support to provide a transfer sheet which is assembled with the support on which the relief is desired before or after exposure. In this case an image-wise transfer of the contents of the microcapsules is effected by subjecting the transfer sheet in contact with the support which is to bear the relief to a uniform rupturing force.

The photosensitive compositions used in of the present invention can be designed to be sensitive to ultraviolet, infrared, visible, X-ray, ion beam radiation and the like. This is accomplished through a judicious selection of the composition and the photoinitiator. Furthermore, while photohardenable compositions are usually employed in the microcapsules, embodiments are also possible wherein photosoftenable compositions are used.

The photohardenable compositions used in the present invention can be selected from among photohardenable compositions which are well known in the art. The most typical examples of such compositions are compositions including ethylenically unsaturated compounds. These compounds contain at least one terminal ethylene group per molecule. Typically, liquid ethylenically unsaturated compounds having two or more terminal ethylene groups per molecule are preferred. Examples of this preferred group are ethylenically unsaturated acid esters of polyhydric alcohols such as ethylene glycol dimethacrylate, triethylene glycol dimethacrylate, trimethylolpropane triacrylate (TMPTA) and trimethyolpropane trimethacrylate (TMPTMA), styrene, divinylbenzene and derivatives thereof. Another example of a useful radiation sensitive composition is an acrylate prepolymer derived from the partial reaction of pentaerythritol with acrylic acid, methacrylic acid, or acrylic or methacrylic acid esters.

Photopolymerizable prepolymers are also useful in the present invention. Suitable prepolymers can be selected from commercially available acrylate terminated polyurethanes, polyesters and polyethers. Typically, these compounds are prepared by end capping isocyanate terminated prepolymers with acrylic or methacrylic acid. The prepolymers can range up to about 16,000 in molecular weight, but in most cases do not exceed about 1,000 to 3,000 in molecular weight. If the molecular weight of the prepolymer is too high, it may be too viscous to be adequately emulsified for encapsulation and released from the microcapsules. However, higher molecular weight prepolymers can be used in the present invention if they are diluted with low molecular weight reactive monomers such as TMPTA.

Representative examples of acrylate terminated urethane prepolymers which may be useful in the present invention include Chempol 19-4832 and Chempol 19-4833 available from Freeman Chemical Corporation; Uvithane 893, 788, 782 and 783 available from Thiokol Corporation; Ebercryl 220, 204, 210 and 240 available from Virginia Chemicals, Inc.; etc. Examples of epoxy acrylate prepolymers include Chempol 19-4824 and Chempol 19-4825 from Freeman Chemical Corp.; Celrad 3200, 3700 and 3701 from Celanese Corp.; Ebercryl 600 series prepolymers from Virginia Chemicals, Inc.; etc.

It is particularly desirable to use a mixture of a multifunctional acrylic monomer such as TMPTA and an acrylate-capped prepolymer such as an acrylate-capped polyurethane in the photosensitive composition. One such composition is made up of 60% of a diacrylate-capped pre-polymer, 30-40% of a monomeric, low molecular weight diacrylate, and up to 10% of TMPTA.

For certain applications, it may be desirable to modify the photohardenable composition to enhance the oleophilic nature of the polymer image that is formed. In particular, ethylenically unsaturated monomers such as TMPTA are relatively hydrophilic. To enhance oleophilicity, it is sometimes desirable to use oleophilic additives such as waxes, cellulose acetate, cellulose nitrate, polybutadiene, and the like. The function of these additives is to enhance the affinity of the polymer image for printing ink in preference to water.

While the present invention will typically be practiced using photohardenable compositions in the microcapsules, embodiments are also possible in which photosoftenable compositions are used. In this case, exposure will result in the internal phase being released from the capsule instead of being retained as with a photohardenable composition. Examples of photosoftenable compositions are described in U.S. Pat. No. 4,399,209.

Another particularly useful type of photosensitive composition is described in commonly assigned U.S. patent application Ser. No. 118,016, filed June 7, 1984, which is incorporated herein by reference. These compositions include a photosensitive precursor of a polymerization inhibitor such as 6-nitroveratraldehyde. These compositions are image-wise exposed to generate the inhibitor which prevents them from polymerizing in the exposed areas when they are subsequently given a uniform exposure at a different wavelength of radiation which otherwise hardens the composition. Within the context of the present invention, photohardenable compositions are negative working. This modification provides a positive working system.

In most cases, the photosensitive composition includes a photoinitiator. It is possible to use either homolytic photoinitiators which are converted to an active species by radiation and generate a radical by abstracting hydrogen from a hydrogen donor, or photoinitiators which complex with a sensitizer to produce a free radical generating species, or photoinitiators which otherwise generate radicals in the presence of a sensitizer. If the system relies upon ionic polymerization, the photoinitiator may be the anion or cation generating type depending on the nature of the polymerization.

Examples of photoinitiators useful in the present invention include diaryl ketone derivatives, and benzoin alkyl ethers. The photoinitiator is selected based on the sensitivity of the system that is desired. Where ultraviolet sensitivity is desired, suitable photoinitiators include alkoxy phenyl ketones, O-acylated oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes.

In many cases it is advantageous to use a combination of compounds to provide a photoinitiator system. Useful systems include co-initiators such as tertiary amines and, more particularly, N,N-dimethylanilines. It is particularly desirable to include a compound such as ethyl p-dimethylaminobenzoate in the initiator composition. The 3-substituted coumarin compounds described in U.S. Pat. No. 4,147,552 are also useful. A combination of Michler's ketone and benzoin methyl ether (ratio 2:5) may be used. A combination of 2,2'-dimethoxy-2-phenylacetophenone, isopropylxanthone and ethyl p-dimethylaminobenzoate (Quanticure EPD); or a combination of Quanticure EPD, Irgacure 651 and 2-chlorothioxanthane can also be used.

The amount of photoinitiator used in the photosensitive composition depends on the particular photohardenable composition selected. It should be present in an amount sufficient to initiate photopolymerization within a reasonably short exposure time. The photoinitiator may also be used to sequester oxygen, which is present in the microcapsules and inhibits photopolymerization. In some cases it is desirable to conduct a non-imaging, oxygen sequestering pre-exposure or co-exposure to sequester the oxygen in the microcapsules before conducting the image-wise exposure. See U.S. Pat. No. 4,482,624. When the photoinitiator is also relied upon to sequester oxygen, it must be used in amounts sufficient to fulfill both this function and its imaging function.

To obtain improved film speed, it may be desirable to incorporate certain prepolymers in the microcapsules such as a diallylo-phthalate prepolymer. Prepolymers such as this are believed to enhance film speed by accelerating the rate with which the viscosity of the internal phase builds upon exposure. Waxes can also be used for this purpose.

In addition to the foregoing materials, certain photohardenable compositions conventionally used in making printing plates may be microencapsulated and used in the present invention, provided of course, that these compositions can be satisfactorily encapsulated. Typical examples include photosensitive phenol-formaldehyde novolak resins, diazo compounds, etc.

The microcapsules used in the present invention are characterized in that they include a discrete capsule wall. Conventional techniques such as coacervation, liquid-liquid phase separation, interfacial polymerization and the like can be used to form the microcapsules.

The photosensitive compositions are usually oleophilic and therefore preferably encapsulated in hydrophilic wall-forming materials such as gelatin-type materials (see U.S. Pat. Nos. 2,730,456 and 2,800,457 to Green et al.) including gum arabic, polyvinyl alcohol, carboxymethyl-cellulose; resorcinol-formaldehyde wall formers (see U.S. Pat. No. 3,755,190 to Hart et al.); isocyanate wall-formers (see U.S. Pat. No. 3,914,511 to Vassiliades); isocyanate-polyol wall-formers (see U.S. Pat. No. 3,796,669 to Kirintani et al.); urea formaldehyde wall-formers (see U.S. Pat. Nos. 4,001,140, 4,087,376 and 4,089,802 to Foris et al.); particularly urea-resorcinol-formaldehyde in which oleophilicity is enhanced by the addition of resorcinol and melamine-formaldehyde wall-formers and hydroxypropyl cellulose (see commonly assigned U.S. Pat. No. 4,025,455 to Shackle). One method for forming microcapsules that is particularly useful is described in U.S. Pat. No. 4,353,809.

It has been found that the microcapsules desirably range from about 3 to 15 microns in diameter. The microcapsules can be coated on a support to form the transfer sheet using conventional coating techniques such as blade coating, air-knife coating, curtain coating, etc. The microcapsules can be applied to the support neat, e.g., dispersed in water, however, it may be desirable to include a small amount of an adhesive such as polyvinyl alcohol or Rohm & Haas latex P-310 with the microcapsules to improve their adhesion to the substrate. Of course, the system must be constructed such that the microcapsule layer is permeable to any developing solution that is used. The microcapsules are preferably coated in a capsule coating weight (solids) of about 1.5 to 5 lbs. per 3000 sq. ft.

Where the microcapsules are carried on a transfer sheet, various substrates can be used including both transparent and opaque substrates such as paper and plastic films such as polyethylene terephthalate. The latter are useful when the transfer sheet is pre-assembled with the printing plate support since they permit the microcapsules to be exposed from the support-side of the transfer sheet.

The transfer sheet can be exposed in an assembled or unassembled condition with the printing plate support. Exposure can be conducted using conventional radiation sources. Among the exposure techniques that can be used are exposure through a mask using ultraviolet or visible radiation, e.g., using a mercury, carbon, or xenon arc or a tungsten lamp; or exposure with an ultraviolet laser, a visible laser, or an argon ion laser.

The present invention can be used to provide relief images on supports conventionally used for this purpose in the art. The present invention is particularly useful in manufacturing printing plates, but those skilled in the art will appreciate that these teachings can also be applied in other applications where relief images are desired including the production of certain printed circuits.

Printing plate supports can be selected from among the supports conventionally used in the art. A support will be selected which exhibits the desired hydrophilic characteristic and good adhesion for the photohardenable composition released from the microcapsules. A preferred support is the anodized aluminum support treated with an alkali metal silicate as described in U.S. Pat. No. 3,181,461. Other useful printing plates supports include oxidized aluminum, stainless steel, cobalt-plated steel, copper-coated steel, chrome-plated steel, coated papers such as polyolefin coated paper, polymeric substrates such as polyethylene terephthalate, copper-coated epoxy, etc.

Conventional etchants and etchable supports can be used herein. Typical examples of etchable supports include acid etchable or alkali etchable metallic layers such as copper, aluminum, zinc, or silicon dioxide. Typical examples of etchants useful in conjunction therewith include ferric chloride to etch copper; hydrochloric, phosphoric or acetic acid to etch aluminum or zinc; and hydrofluoric acid to etch silicon dioxide.

The embodiment shown in FIG. 3 relies upon a combination of a chemically hardenable composition such as a curable or hardenable polymer or prepolymer layer and a chemical hardening agent. An example of a hardenable polymer is gelatin. Hardeners for gelatin are well known. Representative examples are dialdehydes such as glutaraldehyde, glyoxal, and succinaldehyde; and diketones such as 2,5-hexandione, 3-hexane-2,5-dione, and p-benzoquinone. It is also envisioned that the hardenable layer can be a layer of poly(cis-isoprene) which is image-wise crosslinked by the release of an encapsulated but photolysed bis(arylazide).

In the alternative embodiment to FIG. 3, in which the layer on the support is selectively solubilized by the agent released from the microcapsules, a layer of a novolak resin can be rendered soluble in water by the release of an organic acid from the microcapsules such as indene carboxylic acid or a derivative thereof.

A number of techniques can be used to rupture the microcapsules. The most common is application of a pressure roller. The amount of pressure applied should be adjusted such that the microcapsules in the unexposed or underexposed areas are forced to rupture and exude their contents. It is not clear whether this force actually ruptures the microcapsules in the fully exposed areas or not. If the force applied does rupture the fully exposed capsules it should not force these microcapsules to transfer their contents to the printing plate as this will produce background coloring and spotting. In addition to pressure, the microcapsules can be designed to be ruptured by heating or ultrasonically. A fibrous developer roller of the type described in U.S. Pat. No. 4,448,516 can also be used.

Having described the invention in detail and by reference to specific embodiments thereof, it will be apparent that numerous modifications and variations are possible without departing from the spirit and scope of the invention as defined by the following claims.

What is claimed is:

1. A method for forming relief images comprising:
   image-wise exposing a layer of microcapsules to actinic radiation, said microcapsules having discrete capsule walls and containing a photosensitive composition which undergoes a change in viscosity in areas exposed to actinic radiation, said layer of microcapsules being present on a support having an etchable surface or on a separate carrier sheet,
   subjecting said layer of microcapsules to a uniform rupturing force such that said microcapsules rupture and image-wise release said photosensitive composition to said etchable surface,
   applying an etching agent to said etchable surface, said agent thereupon differentially etching said surface,
   and washing said support.

2. The method of claim 1 wherein said photosensitive composition is a photohardenable composition.

3. The method of claim 2 wherein said layer of microcapsules is present on said etchable surface of said support.

4. The method of claim 3 wherein after subjecting said layer of microcapsules to said uniform rupturing force and prior to applying said etching agent, said photosensitive composition released to said etchable surface from said microcapsules is hardened.

5. A method for forming relief images comprising:
   image-wise exposing a layer of microcapsules to actinic radiation, said layer of microcapsules being present on a separate carrier sheet or on a support having a layer of a chemically hardenable composition on the surface thereof; said microcapsules having discrete capsules walls and containing a photosensitive composition which undergoes a change in viscosity in areas exposed to actinic radiation and a hardening agent capable of hardening said hardenable composition;
   subjecting said layer of microcapsules to a uniform rupturing force such that said microcapsules rupture and image-wise release said hardening agent to said layer of said hardenable composition,
   washing said layer of said hardenable composition to remove said layer of microcapsules when said layer of microcapsules is present on said layer of said hardenable composition, and to remove portions of said layer of said hardenable composition not hardened by said hardening agent released from said microcapsules, applying an etching agent to said washed photosensitive material to etch differentially the surface of said support and, re-washing said support.

6. The method of claim 5 wherein said photosensitive composition is a photohardenable composition.

7. The method of claim 6 wherein said layer of microcapsules is present on said support having said layer of said chemically hardenable composition on the surface thereof.

8. A method for forming relief images comprising:

image-wise exposing a layer of microcapsules to actinic radiation, said layer of microcapsules being present on a separate carrier sheet or on a support having a layer of a chemically softenable composition on the surface thereof; said microcapsules having discrete capsules walls and containing a photosensitive composition which undergoes a change in viscosity in areas exposed to actinic radiation and a softening agent capable of softening said softenable composition;

subjecting said layer of microcapsules to a uniform rupturing force such that said microcapsules rupture and image-wise release said softening agent to said layer of said softenable composition, washing said layer of said softenable composition to remove said layer of microcapsules when said layer of microcapsules is present on said layer of said softenable composition, and to remove portions of said layer of said softenable composition softened by said softening agent released from said microcapsules, applying an etching agent to said washed photosensitive material to etch differentially the surface of said support and, re-washing said support.

9. The method of claim 8 wherein said photosensitive composition is a photohardenable composition.

10. The method of claim 9 wherein said layer of microcapsules is present on said support having said layer of said chemically softenable composition on the surface thereof.

11. A method for forming relief images comprising:

image-wise exposing a layer of microcapsules to actinic radiation; said microcapsules having discrete walls and containing an etching agent and a photosensitive composition which undergoes a change in viscosity in response to actinic radiation; said layer of microcapsules being present on a separate carrier sheet or on a support having an etchable surface;

subjecting said layer of microcapsules to a uniform rupturing force in contact with said etchable surface such that said microcapsules rupture and image-wise release said etching agent to said etchable surface, and;

washing said etchable surface.

12. The method of claim 11 wherein said photosensitive composition is a photohardenable composition.

13. The method of claim 12 wherein said layer of microcapsules is present on the surface of said support.

14. The method of claim 13 wherein said layer of microcapsules is present on a carrier sheet.

15. The method of claim 2 wherein said layer of microcapsules is present on a carrier sheet separate from said support having said etchable surface.

16. The method of claim 15 wherein after subjecting said layer of microcapsules to said uniform rupturing force and prior to applying said etching agent, said photosensitive composition released to said etchable surface from said microcapsules is hardened.

17. The method of claim 6 wherein said layer of microcapsules is present on a carrier sheet separate from said support having said layer of a chemically hardenable composition.

18. The method of claim 9 wherein said layer of microcapsules is present on a carrier sheet separate from said support having said layer of a chemically softenable composition.

19. A photosensitive material useful in forming relief images comprising:

a substrate, a layer of an etchable material on the surface of said substrate and a layer of microcapsules overlying said layer of said etchable material, said microcapsules having a discrete wall and containing a photosensitive composition which undergoes a change in viscosity as a result of its exposure to actinic radiation, said photosensitive material being capable of providing a relief image by image-wise exposing said layer of microcapsules to actinic radiation, subjecting said layer of microcapsules to a uniform rupturing force such that said microcapsules rupture and image-wise release said photosensitive composition to said layer of said etchable material, applying an etching agent to said layer of etchable material to differentially etch said layer, and washing said photosensitive material.

20. A combination for producing relief images comprising a transfer sheet including a support having a layer of microcapsules on the surface thereof, said microcapsules containing a photohardenable or photosoftenable composition in the internal phase; and a support having an etchable surface;

said combination being useful in forming relief images by a process including the steps of image-wise exposing said transfer sheet to actinic radiation, assembling said transfer sheet with said support having said etchable surface, subjecting said transfer sheet to a uniform rupturing force such that said microcapsules rupture and said composition is image-wise transferred to said support having said etchable surface, removing said transfer sheet, applying an etching solution to said support and washing said support.

21. The combination of claim 20 wherein said composition is a photohardenable composition.

22. The combination of claim 20 wherein said microcapsules additionally include additionally include said etching agent such that upon subjecting said microcapsules to said uniform rupturing force, said ethcing agent is image-wise released to said etchable surface.

23. A photosensitive material useful in forming relief images comprising:

a substrate having an etchable surface and a layer of microcapsules overlying said etchable surface, said microcapsules having a discrete wall and containing a photohardenable composition and additionally including an etching agent, said photosensitive material being capable of providing relief images by a process which comprises image-wise exposing said layer of microcapsules to actinic radiation, subjecting said layer of microcapsules to a uniform rupturing force such that said microcapsules rupture and image-wise release said etching agent to said etchable surface, said agent thereupon differentially etching said surface, and washing said substrate.

24. A photosensitive material useful in forming relief images comprising:

a substrate having an etchable surface, a layer of microcapsules, and a layer of a chemically hardenable or a chemically softenable composition interposed between said layer of said microcapsules and said etchable surface, said microcapsules having a discrete wall and containing a photohardenable composition and additionally including a chemical agent which is capable of hardening or softening said layer of said chemically hardenable or chemically softenable composition, said photosensitive material being capable of forming relief images by a process which comprises image-wise exposing said layer of microcapsules to actinic radiation, subjecting said layer of microcapsules to a uniform rupturing force such that said microcapsules rupture and image-wise release said agent for chemically hardening or chemically softening said layer of said chemically hardenable or chemically softenable composition, applying an etching agent to said etchable surface, said agent thereupon differentially etching said surface, and washing said substrate.

25. The photosensitive material of claim 24 wherein said layer of said chemically hardenable or chemically softenable composition is a layer of a chemically hardenable composition and said agent is capable of hardening said layer.

26. The photosensitive material of claim 24 wherein said layer of said chemically hardenable or chemically softenable composition is a layer of a chemically softenable composition and said agent is capable of softening said layer.

* * * * *